(12) United States Patent
Liu et al.

(10) Patent No.: US 8,557,626 B2
(45) Date of Patent: Oct. 15, 2013

(54) IMAGE SENSOR DEVICES AND METHODS FOR MANUFACTURING THE SAME

(75) Inventors: Ming-Kai Liu, Taipei County (TW); Tzu-Wei Huang, Hsinchu County (TW); Jui-Hung Chang, Hsinchu (TW); Chia-Hui Huang, Hsinchu (TW); Teng-Sheng Chen, Hsinchu (TW)

(73) Assignees: Omnivision Technologies, Inc., Santa Clara, CA (US); VisEra Technologies Company Limited, Hsinchu (TW)

( * ) Notice: Subject to any disclaimer, the term of this patent is extended or adjusted under 35 U.S.C. 154(b) by 251 days.

(21) Appl. No.: 12/794,257

(22) Filed: Jun. 4, 2010

(65) Prior Publication Data

US 2011/0298073 A1 Dec. 8, 2011

(51) Int. Cl.
*H01L 31/0232* (2006.01)
*H01L 31/0236* (2006.01)

(52) U.S. Cl.
USPC ................ 438/69; 438/71; 257/432; 257/435

(58) Field of Classification Search
USPC .......................................................... 438/69
See application file for complete search history.

(56) References Cited

U.S. PATENT DOCUMENTS

| | | | |
|---|---|---|---|
| 2005/0274883 A1* | 12/2005 | Nagano | 250/239 |
| 2007/0224546 A1* | 9/2007 | Suganaga et al. | 430/322 |
| 2008/0087800 A1* | 4/2008 | Toda | 250/214 C |
| 2008/0291303 A1* | 11/2008 | Onozawa et al. | 348/294 |
| 2009/0162967 A1 | 6/2009 | Cheng | |
| 2009/0215220 A1* | 8/2009 | Toda | 438/87 |

FOREIGN PATENT DOCUMENTS

TW 097119486 7/2009

* cited by examiner

*Primary Examiner* — Johannes P Mondt
(74) *Attorney, Agent, or Firm* — Muncy, Geissler, Olds & Lowe, PLLC

(57) ABSTRACT

Disclosed is a method for forming an image sensor device. First, a lens is provided, and a first sacrificial element is then formed on the lens. Subsequently, an electromagnetic interference layer is formed on the lens and the first sacrificial element, and the first sacrificial element and the electromagnetic interference layer thereon are removed to form an electromagnetic interference pattern having an opening exposing a selected portion of the lens. A second sacrificial element is formed in the opening to cover a center region of the selected portion of the lens, while a peripheral region of the selected portion of the lens remains exposed. Next, a light-shielding layer is formed on the electromagnetic interference pattern, the second sacrificial element, and the peripheral region of the selected portion of the lens. Thereafter, the second sacrificial element and the light-shielding pattern thereon are removed to expose the center region of the selected portion of the lens as a light transmitting region.

10 Claims, 11 Drawing Sheets

IMAGE SENSOR DEVICES AND METHODS FOR MANUFACTURING THE SAME

BACKGROUND OF THE INVENTION

1. Field of the Invention

The invention relates to image sensor devices, and in particular, relates to light transmitting regions of the image sensor images and method for manufacturing the same.

2. Description of the Related Art

Recently, image sensing devices such as solid state image sensing devices are used in a wide range of optoelectronic devices including, for example, digital cameras, cellular phones, toys, and the likes. Conventional image sensing devices include photo sensors such as charge coupled device (CCD) photo sensors and complementary metal oxide semiconductor (CMOS) photo sensors.

In the art of solid state imaging devices, microlenses are typically provided to improve image sensitivity. In addition, a diaphragm is typically provided within the solid state imaging device as a light path filter of the microlenses; thereby regulating the amount of light that passes through the microlenses and toward the photo sensors therein.

The diaphragm is typically defined over a top surface of the microlenses by forming a light-shielding pattern over the top surface of the microlenses by photolithography techniques. Since the microlenses are typically provided with a curved surface, photolithography techniques performed to the portion of a light-shielding layer formed over the curved surface of the microlenses may result in uneven exposure and non-uniformity during patterning thereof. Moreover, the use of photolithography techniques also has disadvantages such as increasing fabrication costs and time.

In Taiwan Patent application No. 097119486, the inventors of the invention utilize energy-induced swelling sacrificial elements to pattern a metal layer to form a light-shielding pattern or an electromagnetic interference pattern. However, the interaction between the metal pattern (serving as the light-shielding pattern/electromagnetic interference pattern) and a lens upper surface is weak, such that the metal pattern easily peels or cracks from the lens upper surface due to subsequent cleaning steps.

Accordingly, a novel method is called for manufacturing the light transmitting region of the image sensor device; such that the product yield is free of the influence of the metal fragments come from the electromagnetic interference pattern.

BRIEF SUMMARY OF THE INVENTION

The invention provides a method for forming an image sensor device, comprising providing a photo sensor having a lens thereon; forming a first sacrificial element on the lens; forming an electromagnetic interference layer on the lens and the first sacrificial element; removing the first sacrificial element and the electromagnetic interference layer on the first sacrificial element to form an electromagnetic interference pattern having an opening exposing the selected portion of the lens; forming a second sacrificial element in the opening to cover a center region of the selected portion of the lens, while a peripheral region of the selected portion of the lens remains exposed; forming a light-shielding layer on the electromagnetic interference pattern, the second sacrificial element, and the peripheral region of the selected portion of the lens; and removing the second sacrificial element and the light-shielding layer on the second sacrificial element, to expose the center region of the selected portion of the lens to serve as a light transmitting region.

The invention also provides an image sensor device, comprising: a photo sensor having a lens thereon; an electromagnetic interference pattern on the lens, wherein the electromagnetic interference pattern has an opening exposing a portion of the lens; a light-shielding pattern on a top surface and a sidewall of the electromagnetic interference pattern, thereby defining a light transmitting region within the opening of the electromagnetic interference pattern.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1A:
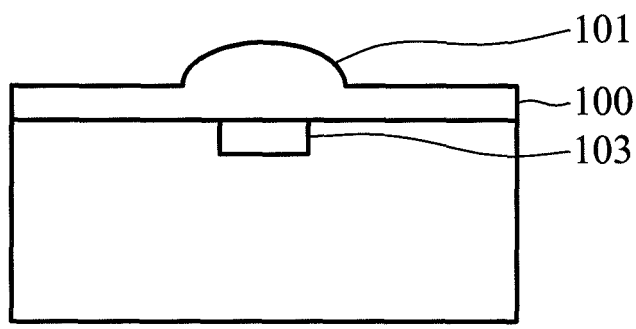
FIGS. 1A-1F are serial cross sections showing the fabrication of an image sensor device in one comparative embodiment of the invention.

FIGS. 1A-1F show a comparative embodiment of the invention. As shown in FIG. 1A, a lens 100 is provided to serve as a supporting feature. A photo sensor 103 under the lens 100 aligns to a curved portion 101 on the top surface of the lens 100. The lens 100 can be glass or plastic. The curved portion 101 and the lens 100 can be in-mold of the same material. Alternatively, the curved portion 101 is additionally formed on the lens 100. The photo sensor 103, corresponding to the predetermined light transmitting region, may include charge-coupled device (CCD) photo sensors, complimentary metal oxide semiconductor (CMOS) photo sensors, or the likes. Furthermore, the photo sensor 103 may include a color filter layer comprising different color filters (e.g. red, green, and blue color filters), a plurality of interconnecting metal layers, and a plurality of inter-layered dielectrics for insulating the interconnecting metal layers. For simplicity, the above functional features in the photo sensor 103 are not shown in the figures, and only the photo sensor 103 with a planar surface is illustrated.

Figure 1B:
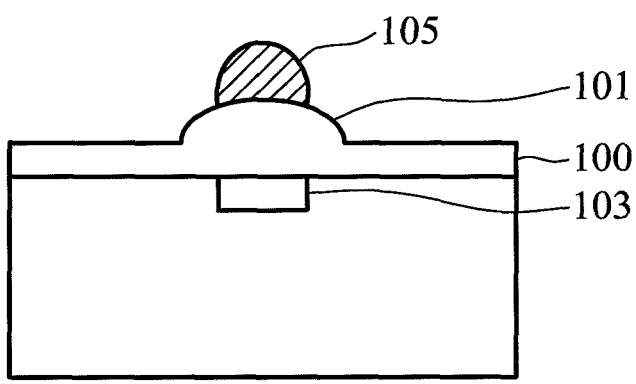

As shown in FIG. 1B, a sacrificial element 105 is then formed on the curved portion 101 of the lens 100. The sacrificial element 105 can be formed by a liquid dispenser such as a gel dispenser, a commercial high precision dispenser, or an electrical printing machine. The sacrificial element 105 is an energy-induced swelling material which contains a chemical foaming agent or a physical foaming agent. The energy-induced swelling material of the sacrificial element 105 allows swelling from its original volume to a larger volume and may finally burst while subjected thereof to an energy source such as thermal energy. The chemical foaming agent, for example, may comprise azobisformamide (ABFA), azodicarbonamide (ADCA), p,p'-oxybis(benzenesulfonyl hydrazide) (OBSH), or N, N'-dinitrosopentamethylenetetramine (DPT), or combinations thereof. The physical foaming agent may comprise, for example, $C_2H_4Cl_2$, Freon, or the combinations thereof.

Figure 1C:
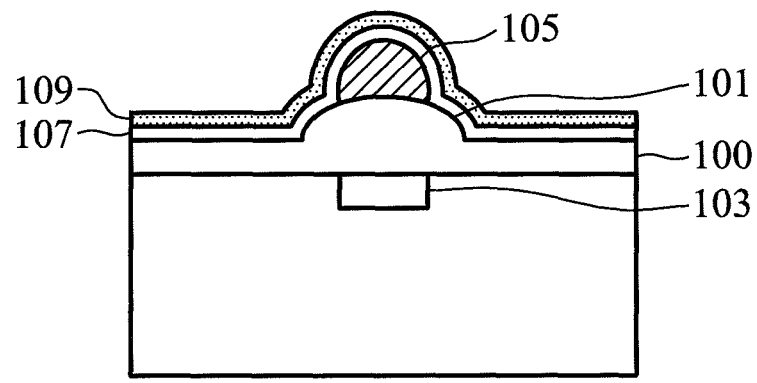

Subsequently as shown in FIG. 1C, an electromagnetic interference layer 107 and a light-shielding layer 109 are sequentially and conformally formed on the structure in FIG. 1B. The electromagnetic interference layer 107 has electrical and/or magnetic conductivity including metal, alloy, or ceramic. The electromagnetic interference layer 107 can be formed by sputtering. Compared to the light-shielding layer 109, the electromagnetic interference layer 107 has lower light-shielding effect and lower interaction with the lens 100. The light-shielding layer 109, without conductivity of electricity and magnetism, is used to shield light and protect the electromagnetic interference layer 107. In one embodiment, the light-shielding layer 109 includes a polymer. The light-shielding layer 109 can be formed by spin-coating.

Figure 1D:
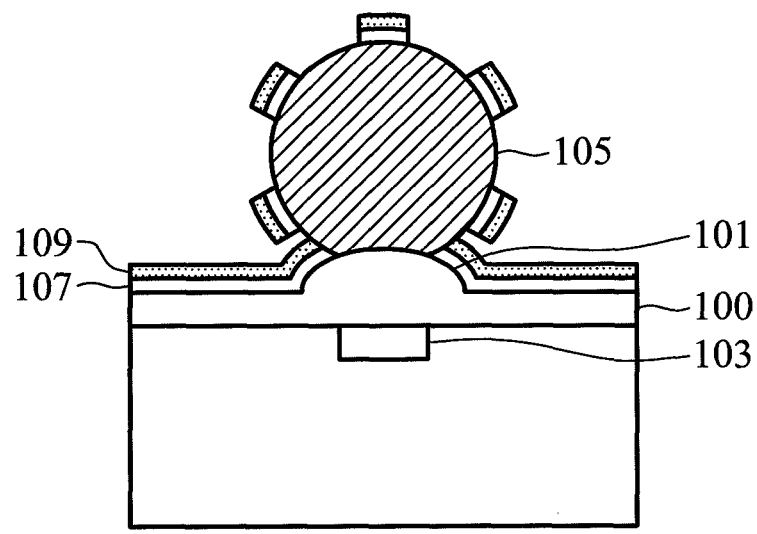
Figure 1E:
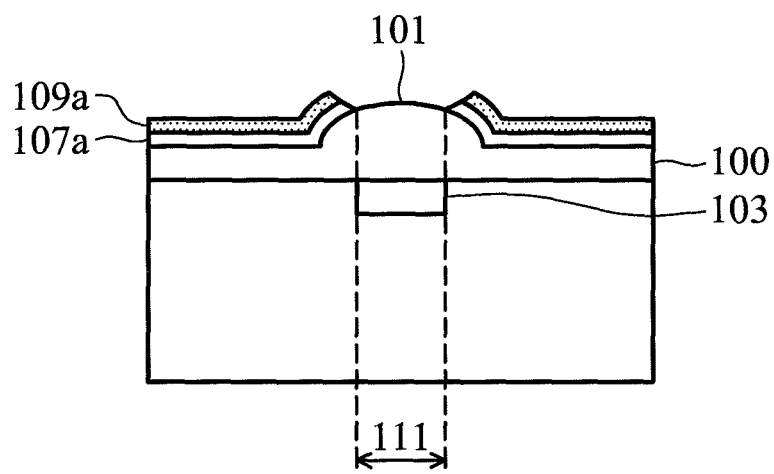
Figure 1F:
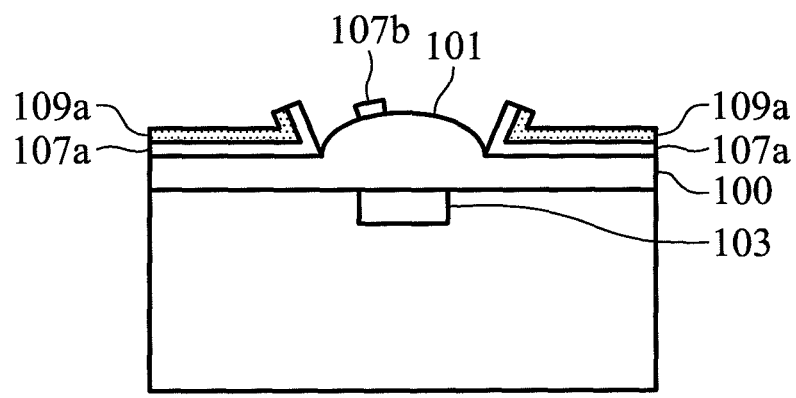

As shown in FIG. 1D, the sacrificial element 105 is subjected an energy to swell until bursting. The energy source can be a thermal process such as a rapid thermal process or a furnace thermal process. After the sacrificial element 105 bursts, an electromagnetic interference pattern 107a, a light-shielding pattern 109a, and a light transmitting region 111 are formed as shown in FIG. 1E. In FIG. 1E, sidewalls of the electromagnetic interference pattern 107a is not covered by the light-shielding pattern 109a. As such, the electromagnetic interference pattern 107a will be peeled, raised, or cracked (e.g. fragment 107b) from the surface of the microlens 101 due to a following cleaning step (especially wet type scrubbing) as shown in FIG. 1F. The described problem is due to the light-shielding pattern 109a not entirely covering the electromagnetic interference pattern 107a, and the problems cannot be solved by changing the material or the removal way of the sacrificial element 105. For example, even if the material of the sacrificial element 105 is replaced by a common polymer, and a laser cutting method is selected to remove the sacrificial element 105 and the electromagnetic interference layer 107 and the light-shielding layer 109 on the sacrificial element 105, the structure in FIG. 1E may still be obtained. Therefore, the image sensor device must confront the peeling, rising, and cracking problems of the electromagnetic interference pattern 109a after the cleaning step, as shown in FIG. 1F.

Figure 2A:
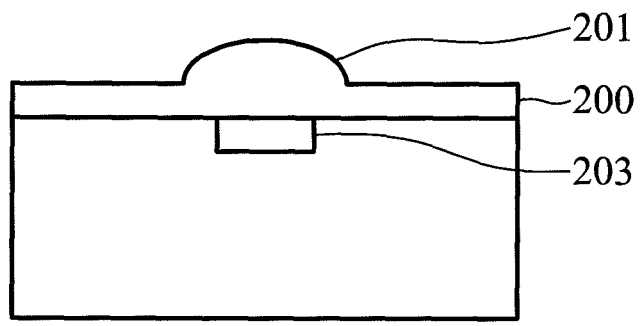
FIGS. 2A-2G are serial cross sections showing the fabrication of an image sensor device in one embodiment of the invention.

For solving the described problem, the invention provides an embodiment to form image sensor devices as shown in FIGS. 2A-2G. In order to clarify the characteristics of the embodiment, the top views of FIGS. 3A-3G correspond to cross sections of FIGS. 2A-2G, respectively. As shown in FIGS. 2A and 3A, a lens 200 is provided. A photo sensor 203, under the lens 200, aligns to the curved portion 201 on the top surface of the lens 200. The materials and the arrangement of the lens 200, the curved portion 201, and the photo sensor 203 are similar to that of FIG. 1A and therefore omitted here.

Figure 2B:
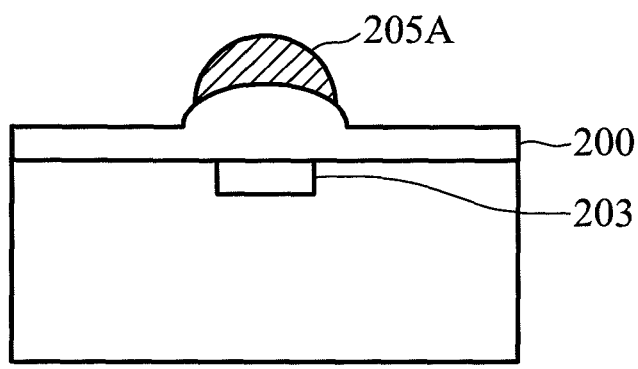
Figure 3A:
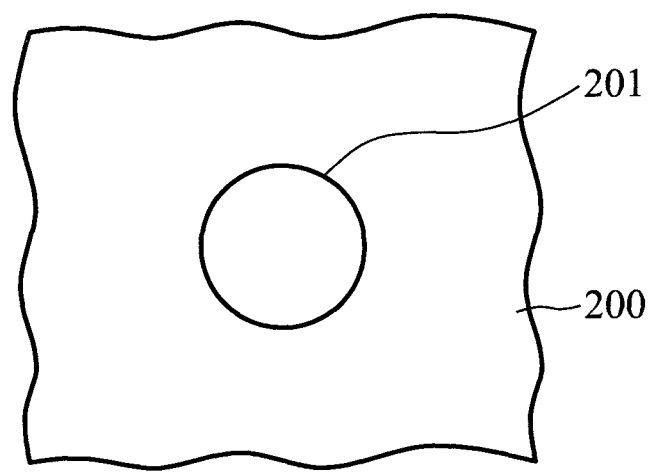
FIGS. 3A-3G are serial top views corresponding to the structures in FIGS. 2A-2G.
Figure 3B:
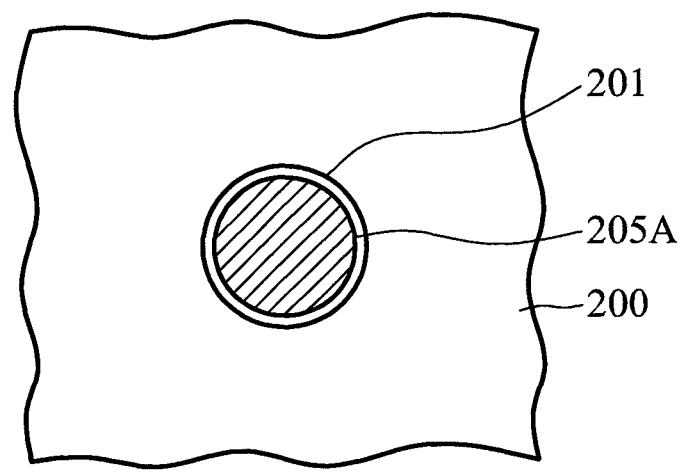

As shown in FIGS. 2B and 3B, a sacrificial element 205A is then formed to cover the curved portion 201. Note that the region covered by the sacrificial element 205A must be larger than the predetermined light transmitting region. Although the region covered by the sacrificial element 205A is slightly smaller than the area of the curved portion 201 in FIGS. 2B and 3B, the sacrificial element 205A may optionally cover the entire curved portion 201, or expand to outside the curved portion 201 if necessary. In one embodiment, the sacrificial element 205A can be composed of the described energy-induced swelling material. In another embodiment, the sacrificial element 205A can be a common polymer. The method of forming the sacrificial element 205A for any material selected to be the sacrificial element 205A, is similar to that of the described sacrificial element 105 and therefore omitted here.

Figure 2C:
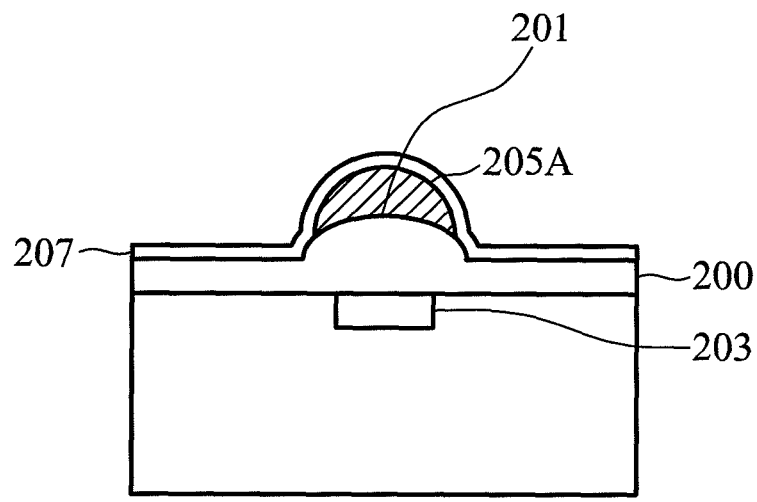
Figure 3C:
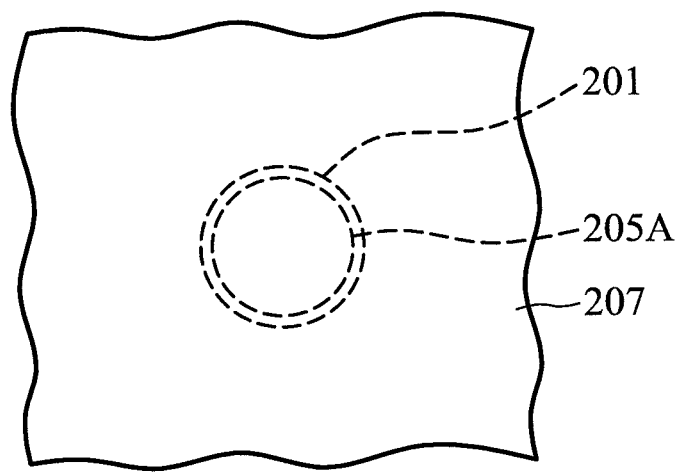

As shown in FIGS. 2C and 3C, an electromagnetic interference layer 207 is then formed on the structure as shown in FIGS. 2B and 3B. The material and the method of forming the electromagnetic interference layer 207 are similar to that of the described electromagnetic interference layer 107 and therefore omitted here.

Figure 2D:
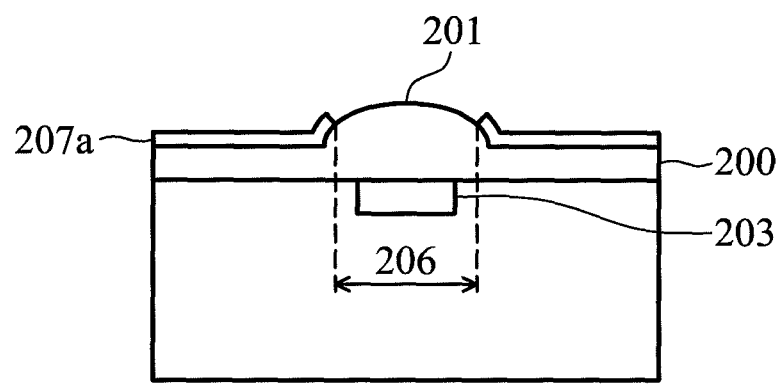
Figure 3D:
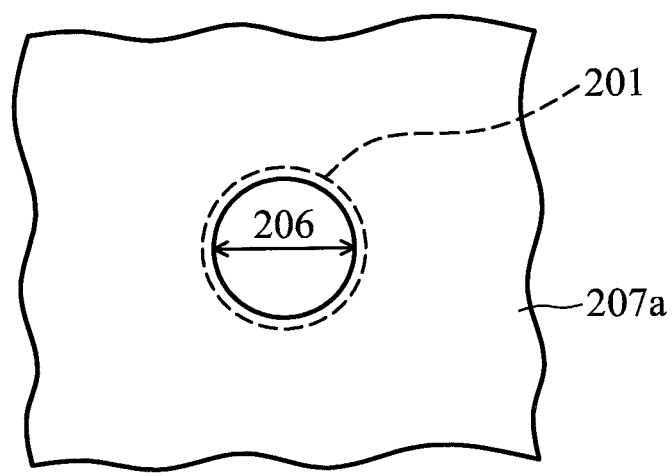

Subsequently, the sacrificial element 205A and the electromagnetic interference layer 207 on the sacrificial element 205A in FIGS. 2C and 3C are then removed. If the sacrificial element 205A is the energy-induced swelling material, it can be removed by subjecting energy to the sacrificial element 205A until bursting. If the sacrificial element 205A is a common polymer, it can be removed by laser cutting. After the removal of the sacrificial element 205, an electromagnetic interference pattern 207a is formed, and an opening 206 is formed to expose a part of the curved portion 201, as shown in FIGS. 2D and 3D. It is understood that the region exposed by the opening 206 is similar to the region covered by the sacrificial element 205A.

Figure 2E:
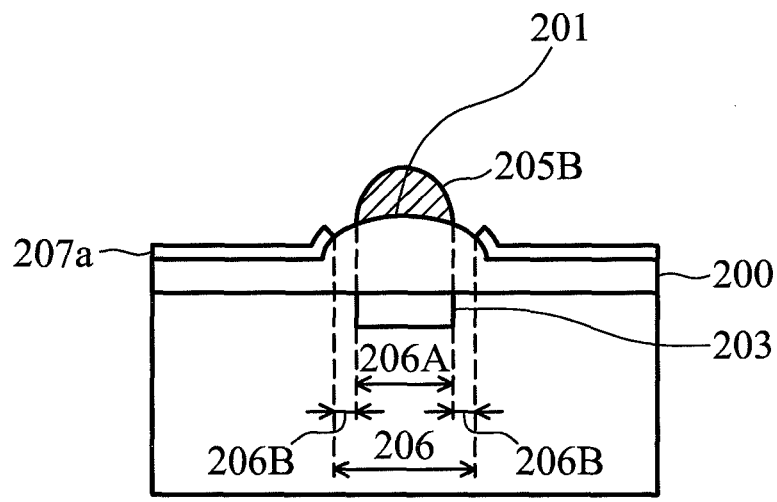
Figure 3E:
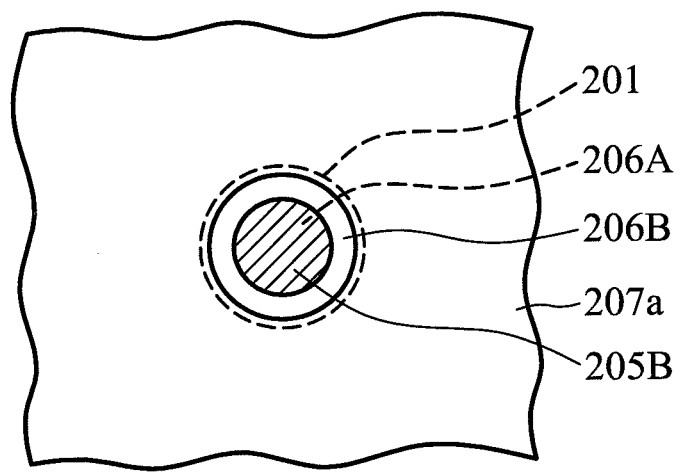

As shown in FIGS. 2E and 3E, a sacrificial element 205B is then formed in the opening 206 to cover a center region 206A of the opening 206, while a peripheral region 206B of the opening 206 remains exposed. Note that this step having a process tolerance determined by the peripheral region 206B. If the sacrificial element 205B misaligns the center region 206A, the subsequently formed light-shielding layer 209 will cover a sidewall of the electromagnetic interference pattern 207A. Similar to the sacrificial element 205A, the sacrificial element 205B can be a common polymer or an energy-induced swelling material. The method of forming the sacrificial element 205B is similar to that of the sacrificial element 105 and therefore omitted here.

Figure 2F:
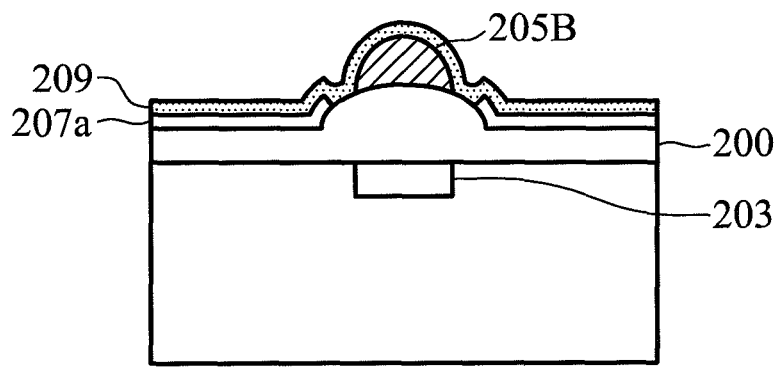
Figure 3F:
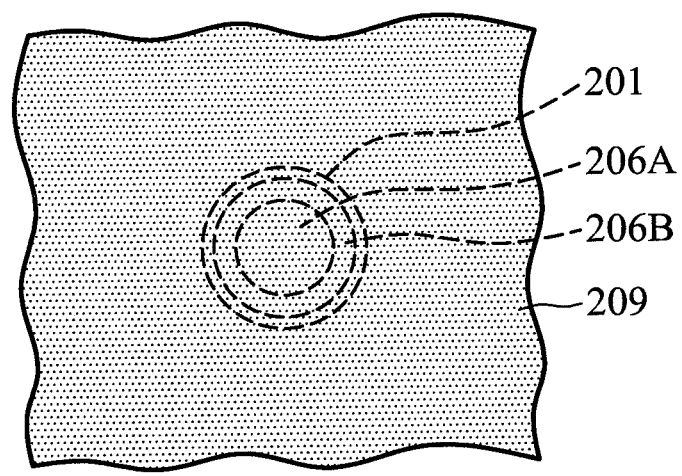

As shown in FIGS. 2F and 3F, a light-shielding layer 209 is conformally formed on the structure of FIGS. 2E and 3E. The method of forming the light-shielding layer 209 is similar to that of the light-shielding layer 109 and therefore omitted here. Note that the light-shielding layer 209 is different from the conventional metallic light-shielding layer. The light-shielding layer 209, e.g. the polymer, has a stronger interaction with the lens 200 than the metal. Moreover, the light-shielding layer 209 has better acidic/basic resistance than the metal.

Figure 2G:
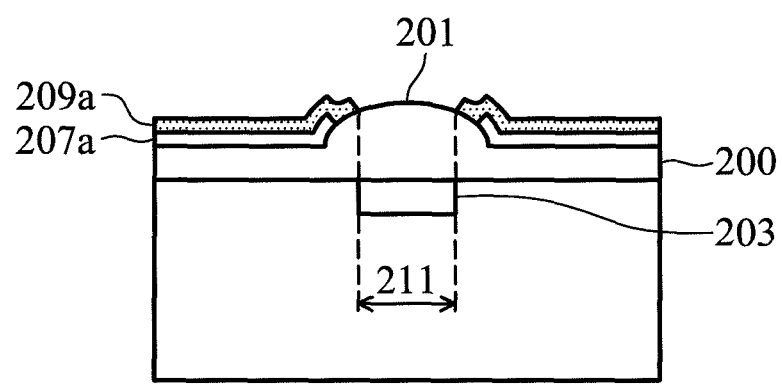
Figure 3G:
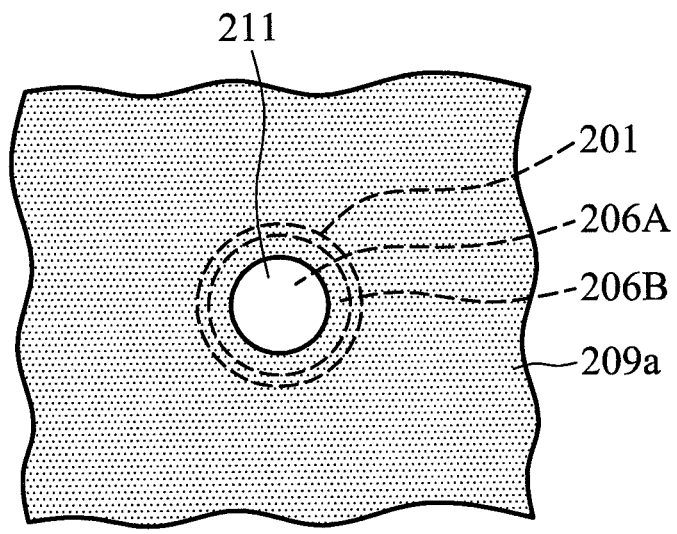

Thereafter, the sacrificial element 205B and the light-shielding layer 209 on the sacrificial element 205B are removed to form a light-shielding pattern 209a. If the sacrificial element 205B is the energy-induced swelling material, it can be removed by subjecting energy to the sacrificial element 205B until bursting. If the sacrificial element 205B is a common polymer, it can be removed by laser cutting. After the removal, a light-shielding pattern 209a is formed, and the light transmitting region 211 is formed to expose the center region 206A of the opening 206 of the lens, as shown in FIGS. 2G and 3G. It is understood that the region exposed by the transmitting region 211 is similar to the region covered by the sacrificial element 205B, e.g. the center region 206A of the opening 206. The light-shielding pattern 209 covers the peripheral region 206B of the opening 206, and covers a sidewall and a top surface of the electromagnetic interference pattern 207a to protect the electromagnetic interference pattern 207a from exposure.

A cleaning step is then processed to remove the fragment, produced by the processes, from the surface of the light transmitting region 211 and the light-shielding pattern 209a. The cleaning step includes gas flowing, wet type scrubbing, or combinations thereof. Because the top surface and the sidewalls of the electromagnetic interference pattern 207a are entirely covered by the light-shielding pattern 209a, the cleaning step will not damage the electromagnetic interference pattern 207. Accordingly, problems such as peeling, rising, or cracking of the conventional electromagnetic interference pattern will not occur in the light transmitting region 211 of the image sensor device in the invention.

Figure 4:
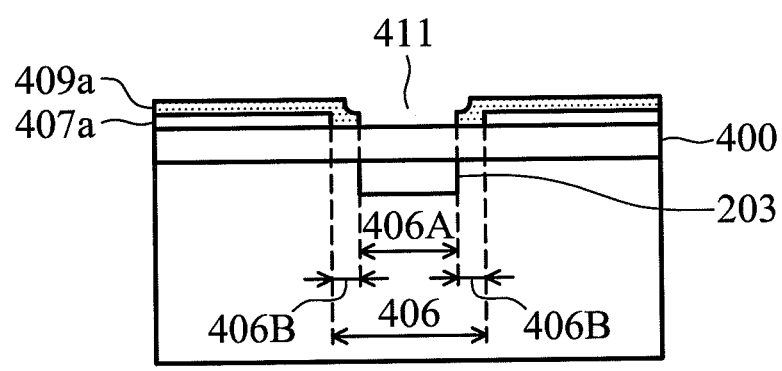
FIG. 4 is an image sensor device in one embodiment of the invention.

Not only does the lens 200 have a curved portion 201, but also, a lens 400 may have a planar upper surface as shown in FIG. 4. The structure in FIG. 4 is similar to the structure in FIGS. 2G and 3G, wherein the electromagnetic interference pattern 407a has an opening 406 to expose a part of the lens 400. In FIG. 4, the light-shielding pattern 409a covers the top surface and the sidewalls of the electromagnetic interference pattern 407a, and the peripheral region 406B of the opening 406. The light transmitting region 411 of the structure is the center region 406A of the opening 406. The method for forming of the light transmitting region 411 is similar to that of the light transmitting region 211 in FIGS. 2A-2G and 3A-3G and therefore omitted here. As described above, the process tolerance is determined by the peripheral region 406B. The light-shielding pattern may cover a sidewall of the electromagnetic interference pattern 407a even if the sacrificial element (not shown) misaligns the center region 406A. It is understood that it does not matter whether the upper surface of the lens is curved or planar, the light-shielding pattern can efficiently protect the electromagnetic interference pattern from the influence of the following cleaning step. As such, product yield will not be reduced by problems such as peeling, rising, or cracking of the electromagnetic interference pattern edge.

Although all of the light transmitting regions in the above embodiments are circular, the described methods may form polygon light transmitting regions. In one embodiment, the light transmitting region is a polygon with rounded sides and/or rounded corners.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for forming an image sensor device, comprising:
    providing a photo sensor having a lens thereon;
    forming a first sacrificial element on the lens;
    forming an electromagnetic interference layer on the lens and the first sacrificial element;
    removing the first sacrificial element and the electromagnetic interference layer on the first sacrificial element to form an electromagnetic interference pattern having an opening exposing a selected portion of the lens;
    forming a second sacrificial element in the opening to cover a center region of the selected portion of the lens, while a peripheral region of the selected portion of the lens remains exposed;
    forming a light-shielding layer on the electromagnetic interference pattern, the second sacrificial element, and the peripheral region of the selected portion of the lens; and
    removing the second sacrificial element and the light-shielding layer on the second sacrificial element, to expose the center region of the selected portion of the lens to serve as a light transmitting region.

2. The method as claimed in claim 1, wherein the step of removing the second sacrificial element and the light-shielding layer on the second sacrificial element forms a light-shielding pattern on the peripheral region of the selected portion of the lens, and on a top surface and a sidewall of the electromagnetic interference pattern.

3. The method as claimed in claim 1, further comprising cleaning the light transmitting region and the light-shielding layer surface after the step of removing the second sacrificial element and the light-shielding layer on the second sacrificial element.

4. The method as claimed in claim 1, wherein the lens has a planar upper surface.

5. The method as claimed in claim 1, wherein the lens has a curved upper surface.

6. The method as claimed in claim 1, wherein the step of removing the first sacrificial element and the electromagnetic interference layer on the first sacrificial element comprises:
    subjecting an energy to the first sacrificial element to swell the first sacrificial element until bursting, wherein the first sacrificial element is an energy-induced swelling material.

7. The method as claimed in claim 1, wherein the step of removing the first sacrificial element and the electromagnetic interference layer on the first sacrificial element comprises a laser cutting.

8. The method as claimed in claim 1, wherein the step of removing the second sacrificial element and the light-shielding layer on the second sacrificial element comprises:
    subjecting an energy to the second sacrificial element to swell the second sacrificial element until bursting, wherein the second sacrificial element is an energy-induced swelling material.

9. The method as claimed in claim 1, wherein the step of removing the second sacrificial element and the light-shielding layer on the second sacrificial element comprises a laser cutting.

10. The method as claimed in claim 1, wherein the photo sensor aligns to the light transmitting region.

* * * * *